(12) United States Patent
Kim et al.

(10) Patent No.: US 12,324,328 B2
(45) Date of Patent: Jun. 3, 2025

(54) DISPLAY DEVICE

(71) Applicant: LG Display Co., Ltd., Seoul (KR)

(72) Inventors: Jung-Chul Kim, Paju-si (KR); Ji-Eun Kang, Paju-si (KR); Han-Wook Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 628 days.

(21) Appl. No.: 17/552,203

(22) Filed: Dec. 15, 2021

(65) Prior Publication Data
US 2022/0199748 A1  Jun. 23, 2022

(30) Foreign Application Priority Data
Dec. 23, 2020  (KR) .................. 10-2020-0181980

(51) Int. Cl.
| | |
|---|---|
| *H10K 59/131* | (2023.01) |
| *H10K 50/824* | (2023.01) |
| *H10K 59/126* | (2023.01) |
| *H10K 59/65* | (2023.01) |

(52) U.S. Cl.
CPC ......... *H10K 59/131* (2023.02); *H10K 50/824* (2023.02); *H10K 59/126* (2023.02); *H10K 59/65* (2023.02)

(58) Field of Classification Search
CPC .................................................. H10K 59/131
See application file for complete search history.

(56) References Cited

U.S. PATENT DOCUMENTS

| | | | |
|---|---|---|---|
| 10,930,867 B2 | 2/2021 | Kim et al. | |
| 10,964,771 B2 | 3/2021 | Lee et al. | |
| 2020/0144352 A1 | 5/2020 | Lee et al. | |
| 2020/0176538 A1* | 6/2020 | Um | H10K 59/121 |
| 2020/0176539 A1* | 6/2020 | Sung | H10K 59/805 |
| 2020/0176657 A1 | 6/2020 | Jang et al. | |
| 2020/0313102 A1 | 10/2020 | Kim et al. | |
| 2020/0365674 A1 | 11/2020 | Jeon et al. | |
| 2021/0091160 A1* | 3/2021 | Lee | H10K 50/86 |
| 2021/0175446 A1 | 6/2021 | Kim et al. | |
| 2021/0335988 A1* | 10/2021 | Um | G06F 3/0202 |

FOREIGN PATENT DOCUMENTS

| | | |
|---|---|---|
| KR | 10-2017-0013553 A | 2/2017 |
| KR | 10-2020-0051108 A | 5/2020 |
| KR | 10-2020-0065161 A | 6/2020 |
| KR | 10-2020-0113957 A | 10/2020 |
| KR | 10-2020-0131397 A | 11/2020 |

OTHER PUBLICATIONS

Korean Intellectual Property Office, Office Action, Korean Patent Application No. 10-2020-0181980, Apr. 28, 2025, 11 pages.

\* cited by examiner

*Primary Examiner* — Mounir S Amer
(74) *Attorney, Agent, or Firm* — Fenwick & West LLP

(57) ABSTRACT

A display device includes: a through hole; a line region surrounding the through hole; a display region surrounding the line region; first to fourth layer lines which are located in the line region and at different layers; auxiliary layer lines which are located below the first layer lines or on the fourth layer lines; pixels located in the display region; first signal lines which are electrically connected to the pixels and are along a first direction; and second signal lines which are electrically connected to the pixels and are along a second direction intersecting the first direction, wherein the auxiliary layer lines electrically connected to one of the second signal lines.

14 Claims, 3 Drawing Sheets

DISPLAY DEVICE

CROSS REFERENCE TO RELATED APPLICATIONS

The present application claims the priority benefit of Korean Patent Application No. 10-2020-0181980 filed in Republic of Korea on Dec. 23, 2020, which is hereby incorporated by reference in its entirety for all purposes as if fully set forth herein.

BACKGROUND

Field of the Invention

The present invention relates to a display device, and more particularly, relates to a display device including a through hole in a display region displaying an image.

Discussion of the Related Art

Recently, with the advent of an information-oriented society, an art field of a display visually representing an electrical signal has progressed rapidly and in response to this, various flat display devices having excellent capabilities of thin profile, light weight, and low power consumption have been developed and have replaced a conventional cathode ray tube (CRT).

As detailed examples of the flat display devices, a liquid crystal display device (LCD), a plasma display panel device (PDP), a field emission display device (FED), and an organic light emitting display device (OLED) have been used.

The organic light emitting display device is a self-luminescent device and has a good viewing angle. Thus, the organic light emitting display device draws attention as a next generation display device.

The organic light emitting display device is applied to various electronic devices such as a television, a smartphone, an electronic book, a monitor and a laptop computer.

As the organic light emitting display device is used for the various electronic devices, when designing a form of the organic light emitting display device, a technology demand to increase a ratio of a display region providing an image and to relatively reduce a peripheral region not providing an image has increased.

Accordingly, the organic light emitting display device includes a hole in a display region in which an electronic element(s) (e.g., a camera, a photo-sensing element, and/or a heat-sensing element) is located. Because the hole is formed in the display region, a hole bezel as a dead space where lines are located and formed around the hole where the electronic element is located.

Recently, a technology of reducing the hole bezel has been required.

SUMMARY

Accordingly, the present invention is directed to a display device that substantially obviates one or more of the problems due to limitations and disadvantages of the related art.

An advantage of the present invention is to provide an organic light emitting display device which can reduce a hole bezel of the display device with a hole in a display region having an electronic element therein, and can improve deviation of current and thus uniformity and reliability of brightness.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a display device includes: a through hole; a line region surrounding the through hole; a display region surrounding the line region; first to fourth layer lines which are located in the line region and at different layers; auxiliary layer lines which are located below the first layer lines or on the fourth layer lines; pixels located in the display region; first signal lines which are electrically connected to the pixels and are along a first direction; and second signal lines which are electrically connected to the pixels and are along a second direction intersecting the first direction, wherein the auxiliary layer lines electrically connected to one of the second signal lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments, examples of which are illustrated in the accompanying drawings. The same reference numbers may be used throughout the drawings to refer to the same or like parts.

Figure 1:
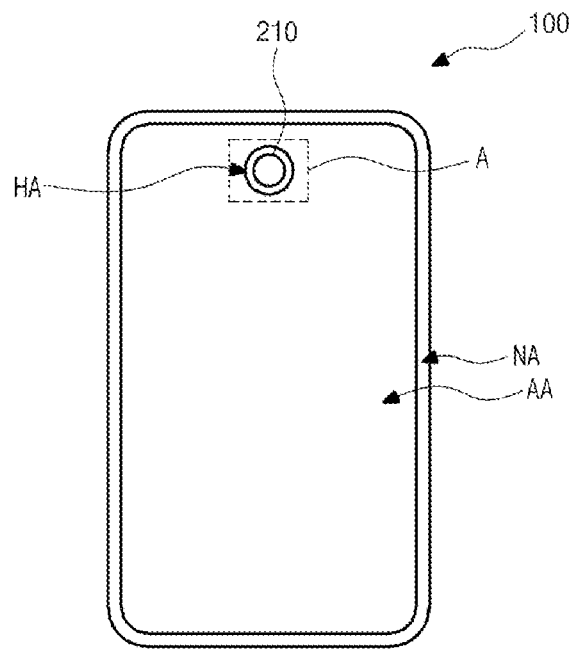
FIG. 1 is a schematic view illustrating an organic light emitting display device according to an embodiment of the present invention.

FIG. 1 is a schematic view illustrating an organic light emitting display device according to an embodiment.

Prior to detailed explanations, a portable terminal is shown as an example to which an organic light emitting display device 100 according to this embodiment is applied The portable terminal may be a table PC, a smart phone, a personal digital assistant (PDA), a portable multimedia player (PMP), a game console, a watch type electronic device or the like.

However, the present invention is not limited to a specific electronic device to which the organic light emitting display device 100 is applied. For example, in another embodiment of the present invention, the organic light emitting display device 100 may be used for a large-sized electronic device such as a television or an outdoor billboard, or a small-sized or medium-sized electronic device such as a personal computer, a laptop computer, a navigation device for a vehicle, a smart watch or a camera.

Referring to FIG. 1, the organic light emitting display device according to an embodiment of the present invention may include a display region AA where an image is displayed, and a non-display region NA outside the display region AA.

The display region AA may be a region where a plurality of pixels (P of FIG. 2) are arranged to display an image. One pixel P may include a pixel circuit and an organic light emitting diode which is applied with a current to emit a light.

The non-display region NA may be a region surrounding the display region AA. In the non-display region NA, a gate driving portion (not shown) and a data driving portion (not shown) to supply respective signals to each of the plurality of pixels P may be located. The gate driving portion may be a part applying a gate signal, and may be located at one side or both sides in a transverse (or horizontal) direction with respect to the display region AA. The data driving portion may be a part applying a data signal, and may be located at one side or both sides in a longitudinal (vertical) direction with respect to the display region AA A through hole 210 may be located in the display region AA. In the through hole 210, at least one electronic element may be located. The electronic element may be a camera, a speaker, a photo-sensor, a heat-sensor, a microphone or the like.

In FIG. 1, the through hole 210 which is formed in a circular shape at a center of an upper portion of the display region AA is shown by way of example. However, a position, a shape and a number of the through hole 210 is not limited. The through hole 210 may have one of various shapes including a polygonal shape such as a quadrangular shape and an elliptical shape.

A hole bezel region HA may be formed around the through hole 210.

The hole bezel region HA may be a region surrounding a periphery of the through hole 210, may be a region located between the through hole 210 and the display region AA which is adjacent to the through hole 210, and may be a region surrounded by the display region AA.

In the hole bezel region HA, a plurality of gate lines (GL of FIG. 2) and a plurality of data lines (DL of FIG. 2) to supply the pixels P located around the through hole 210 with signals may be located.

The through hole 210 and the hole bezel region HA are described below in more detail with reference to FIG. 2.

Figure 2:
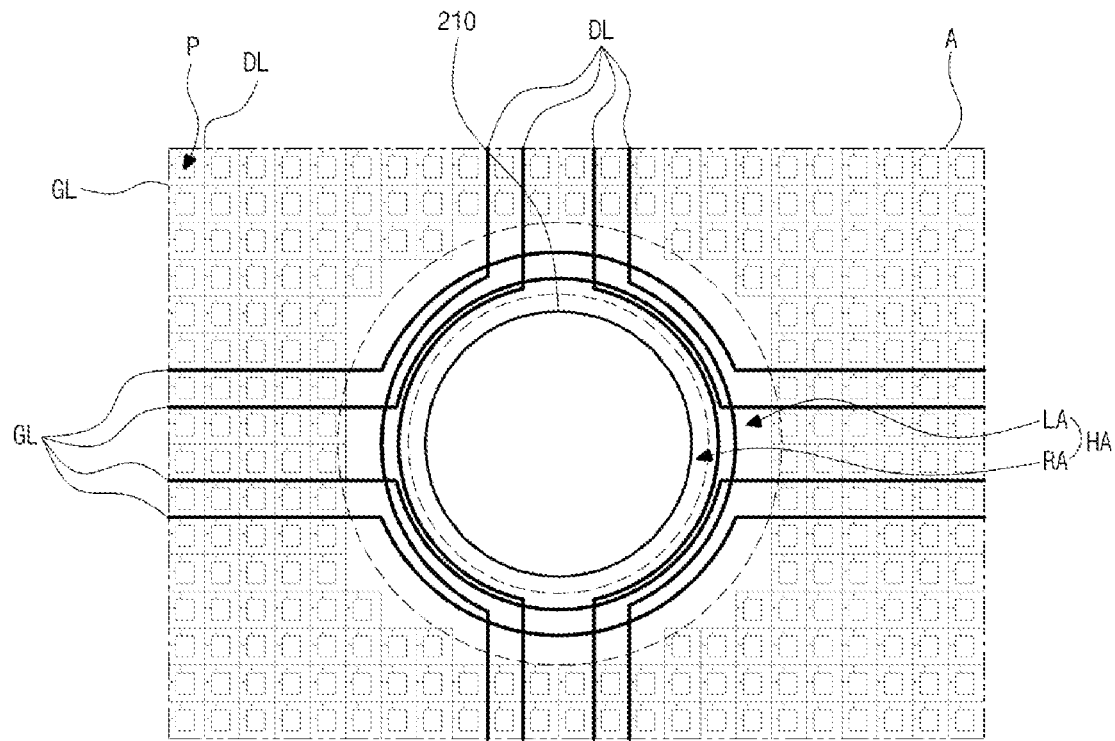
FIG. 2 is a view schematically illustrating a region A of FIG. 1.

FIG. 2 is a view illustrating a region A of FIG. 1. The region A includes the through hole 210, the hole bezel region HA, and a portion of the display region AA.

Referring to FIG. 2, the hole bezel region HA may include a circumference region RA and a line region LA. The circumference region RA may be an inner region of the hole bezel region HA surrounding the periphery of the through hole 210, and gate lines GL (or first signal lines) and data lines DL (or second signal lines) may not be located in the circumference region RA.

The circumference region RA may be a region which serves to prevent damage to the lines GL and DL when a laser irradiation is conducted to form the through hole 210, and thus a minimum width needs to be maintained constant.

The line region LA may be an outer (or remaining) region of the hole bezel region HA surrounding the periphery of the through hole 210, and the plurality of gate lines GL and the plurality of data lines DL may be located in the line region LA.

The gate line GL and the data line DL may be formed to have a semi-circular structure along an outer circumference surface of the through hole 210 and bypass the through hole 210. The plurality of gate lines GL may extend in a transverse direction around the through hole 210. The plurality of gate lines GL may be configured with a scan line, an emission control line, an initialization voltage line and/or the like according to signals.

The plurality of data lines DL may extend in a longitudinal direction around the through hole 210. The plurality of data lines DL may be configured with driving voltage lines, driving low voltage lines and/or the like according to signals.

The gate line GL and the data line DL according to an embodiment of the present invention may be formed to be divided into a plurality of lines which are located at different layers with insulating layers (109a, 109b, 109c, 109d and 109e of FIG. 3) interposed therebetween. The circumference region RA and the line region LA surrounding the through hole 210 are described below in more detail with reference to FIG. 3.

Figure 3:
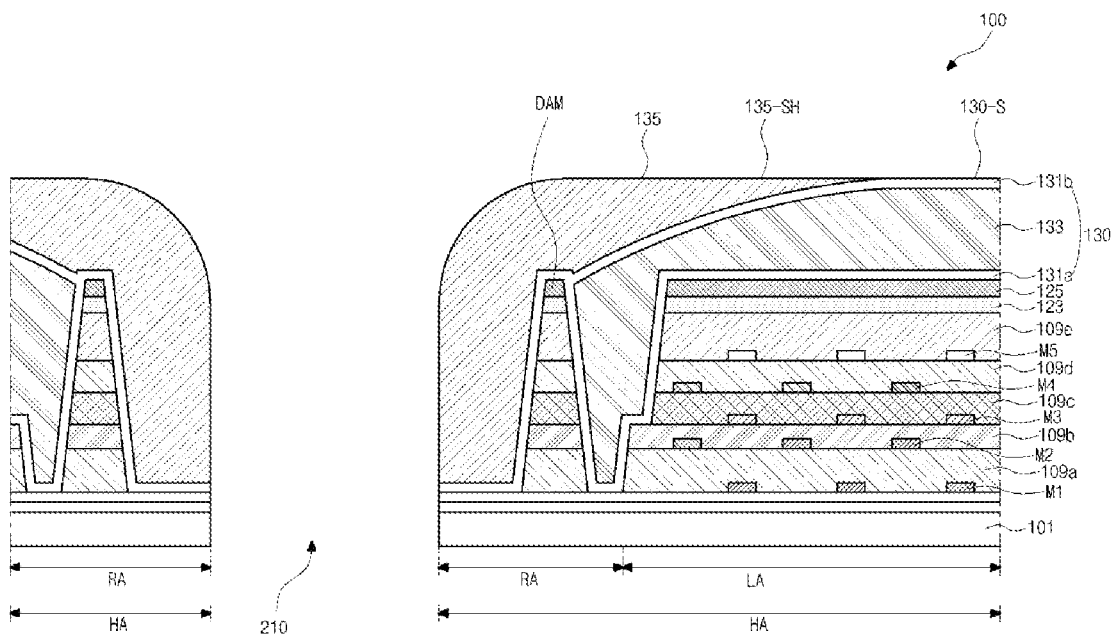
FIG. 3 is a cross-sectional view schematically illustrating a through hole and a hole bezel region according to an embodiment of the present invention.

FIG. 3 is a cross-sectional view schematically illustrating a through hole and a hole bezel region according to an embodiment of the present invention.

Referring to FIG. 3, the through hole 210 may be formed on a substrate 101, and the circumference region RA and the line region LA may be defined in the hole bezel region HA around the through hole 210.

In the line region LA of the substrate 101, a plurality of signal lines M1, M2, M3, M4 and M5 may be located. The plurality of signal lines M1, M2, M3, M4 and M5 may be via lines passing near the through hole 210 and may include a first layer line M1, a second layer line M2, a third layer line M3, a fourth layer line M4, and a fifth layer line M5.

A part of the first to fifth layer lines M1 to M5 may be electrically connected to the gate line GL, and the other part of the first to fifth layer lines M1 to M5 may be electrically connected to the data line DL.

The first and second layer lines M1 and M2 may include the gate line GL. The plurality of first and second layer lines M1 and M2 may be configured with a scan line applied with a scan signal, an emission control line applied with an emission control signal, an initialization voltage line applied with an initialization voltage and/or the like.

The third to fifth layer lines M3 to M5 may include the data line GL. The plurality of third to fifth layer lines M3 to M5 may be configured with a data line applied with a data voltage, a driving voltage line applied with a driving voltage, a driving low voltage line applied with a driving low voltage and/or the like. Further, the third to fifth layer lines M3 to M5 may be configured with a source electrode (111a of FIG. 4) or a drain electrode (111b of FIG. 4) of a thin film transistor (DTr of FIG. 4).

A first inter-layered insulating layer 109a may be located between the first and second layer lines M1 and M2. A second inter-layered insulating layer 109b may be located between the second and third layer lines M2 and M3. A third inter-layered insulating layer 109c may be located between the third and fourth layer lines M3 and M4. A fourth inter-layered insulating layer 109d may be located between the fourth and fifth layer lines M4 and M5.

This is explained later in more detail.

An opening portion may be defined in a bank insulating layer 109e located on the fifth layer line M5. The opening portion may expose at least part of an anode (121 of FIG. 4) forming an organic light emitting diode (E of FIG. 4).

An emitting layer 123 of the organic light emitting diode E may be located on the bank insulating layer 109e and correspond to the opening portion defined by the bank insulating layer 109e. A cathode 125 may be located on the emitting layer 123.

A protection film 130 in a thin film type may be located on the cathode 125. By attaching the protection film 130 to the substrate 101, the organic light emitting display device 100 may be encapsulated.

The protection film 130 may use at least two inorganic protection films 131a and 131b in order to prevent an external oxygen or moisture from permeating the organic light emitting display device 100. In this case, it is preferable that an organic protection film 133 is interposed between the two inorganic protection films 131a and 131b in order to complement an impact resistance.

Accordingly, the organic light emitting display device 100 can prevent an external oxygen or moisture from permeate the organic light emitting display device 100.

A dam DAM may be located outside the first to fourth inter-layered insulating layers 109a, 109b, 109c and 109d. The dam DAM may fully surround the through hole 210. The dam DAM may restrict the organic protection film 133 of the protection film 130, which protects elements (e.g., the thin film transistor DTr and the organic light emitting diode E) of the organic light emitting display device 100 from particles that is able to permeate from the outside, to be located stably in an inner region of the dam DAM.

The dam DAM may be formed by stacking the first to fourth inter-layered insulating layers 109a, 109b, 109c and 109d and the bank insulating layer 109e.

A cover layer 135 may be formed between the through hole 210 and the dam DAM. The cover layer 135 may cover an uneven surface formed by the dam DAM and provide an even surface 135-SH. The even surface 135-SH defined by the cover layer 135 may define the same plane as an even surface 130-S defined by the protection film 130.

In the organic light emitting display device 100 according to an embodiment of the present invention, because the line region LA of the hole bezel region HA is configured with the first to fifth layer lines M1, M2, M3, M4 and M5, a width of the line region LA may be reduced.

In other words, because the lines M1, M2, M3, M4 and M5 which were located at the same layer are located at different layers, a width of the line region LA may be reduced.

As the width of the line region LA may be reduced, the hole bezel region HA may also be reduced. Thus, the display device 100 having a narrow hole bezel as required recently can be provided.

First Embodiment

Figure 4:
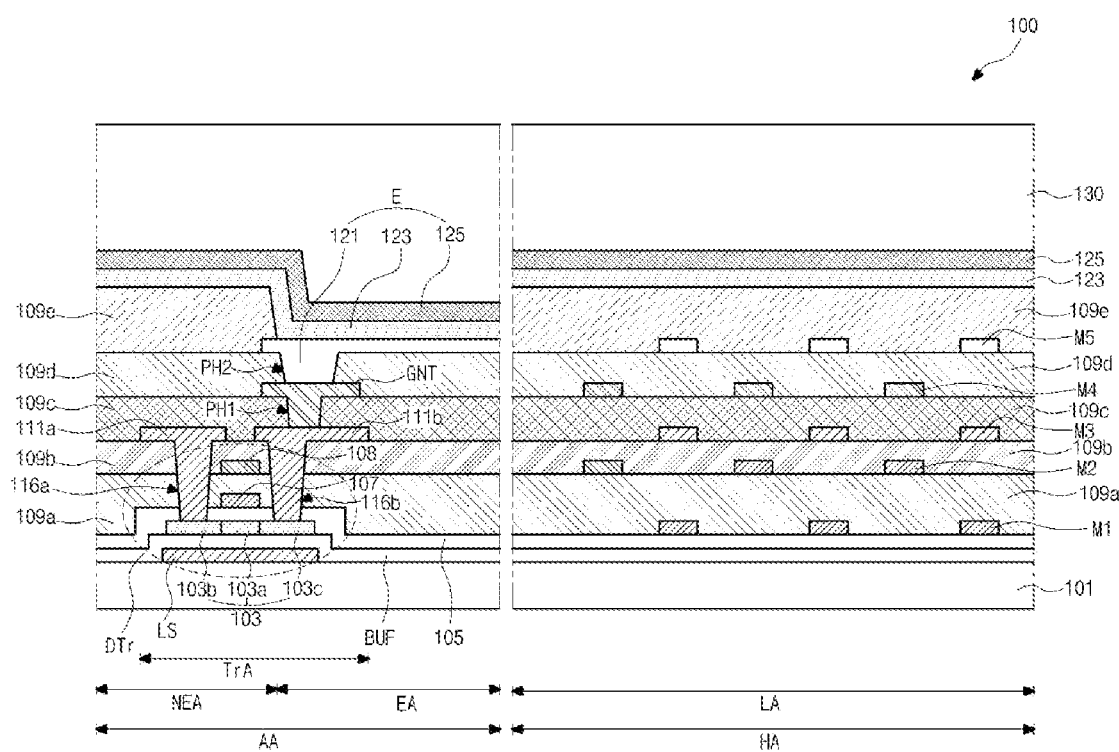
FIG. 4 is a cross-sectional view illustrating a structure of a pixel and a line region of a hole bezel region of an organic light emitting display device according to a first embodiment of the present invention.

FIG. 4 is a cross-sectional view illustrating a structure of a pixel and a line region of a hole bezel region of an organic light emitting display device according to a first embodiment of the present invention.

Referring to FIG. 4, in the organic light emitting display device 100, a display region AA and a hole bezel region HA may be defined on a substrate 101. In the display region AA, a plurality of pixels (P of FIG. 2) may be arranged, and an image may be displayed by the plurality of pixels P.

For the purpose of explanations, each pixel P of the display region AA may include an emission region EA which includes an organic light emitting diode E and actually displays an image, and a non-emission region NEA which is located around an edge of the emission region EA and includes a switching region TrA where a driving thin film transistor DTr is formed.

A buffer layer BUF may be located on the substrate 101. In the switching region TrA located in the non-emission region NEA of each pixel P, a semiconductor layer 103 may be located on the buffer layer BUF.

The semiconductor layer 103 may be formed of silicon. The semiconductor layer 103 may include an active region 103a forming a channel at a center portion thereof, and source and drain regions 103b and 103c doped with high concentrated impurities at both sides of the active region 103a.

The semiconductor layer 103 may be formed of one of polycrystalline silicon, low temperature polycrystalline, and oxide semiconductor material. In case of a top gate structure, a light blocking layer LS may be formed below the semiconductor layer 103 in order to prevent an external light from affecting a property of the driving thin film transistor DTr.

A gate insulating layer 105 may be formed on the substrate 101 having the light blocking layer LS and the semiconductor layer 103. A gate electrode 107 corresponding to the active region 103a of the semiconductor layer 103, and a gate line (GL of FIG. 2) may be formed on the gate insulating layer 105. The gate electrode 107 may be connected to one electrode of a storage capacitor.

In the line region LA of the hole bezel region HA, a plurality of first layer lines M1 may be located on the gate insulating layer 105 and be spaced apart from each other at predetermined intervals. The first layer lines M1 may be located at the same layer as the gate line GL and the gate electrode 107, and may be electrically connected to the gate line GL.

A first inter-layered insulating layer 109a may be formed on the gate electrode 107, the gate line GL and the first layer lines M1. An upper electrode 108 may be located on the first inter-layered insulating layer 109a corresponding to the gate electrode 107. The upper electrode 108 may be connected to the other electrode of the storage capacitor.

In the line region LA of the hole bezel region HA, a plurality of second layer lines M2 may be located on the first inter-layered insulating layer 109a and be spaced apart from each other at predetermined intervals. The second layer lines M2 may be electrically connected to an emission control line.

In the first embodiment, the emission control line may be omitted. In this case, the first layer line M1 may be electrically connected to one gate line GL, and the second layer line M2 may be electrically connected to another gate line GL.

In the switching region TrA, the first and second 109a and 109b and the gate insulating layer 105 may include a first semiconductor contact hole 116a and a second semiconductor contact hole 116b exposing the source region 103b and the drain region 103c, respectively, which are located at both sides of the active region 103a.

A source electrode 111a and a drain electrode 111b may be located on the second inter-layered insulating layer 109b having the first and second semiconductor contact holes 116a and 116b. The source and drain electrodes 111a and 111b may be spaced apart from each other and contact the source and drain regions 103b and 103c exposed through the first and second semiconductor contact holes 116a and 116b, respectively.

In the line region LA of the hole bezel region HA, a plurality of third layer lines M3 may be located on the second inter-layered insulating layer 109b and be spaced apart from each other at predetermined intervals. The third layer lines M3 may be located at the same layer as the data line DL and the source and drain electrodes 111a and 111b and may be electrically connected to the data line DL.

A third inter-layered insulating layer 109c may be located on the source and drain electrodes 111a and 111b and the third layer line M3.

The source and drain electrodes 111a and 111b, the semiconductor layer 103 including the source and drain regions 103b and 103c contacting the source and drain electrodes 111a and 111b, the gate insulating layer 105 on the semiconductor layer 103, and the gate electrode 107 may form the driving thin film transistor DTr.

A drain contact hole PH1 may be formed in the third inter-layered insulating layer 109c and expose the drain electrode 111b. A connection electrode GNT may be formed on the third inter-layered insulating layer 109c and contact the drain electrode 111b exposed through the drain contact hole PH1.

In the line region LA of the hole bezel region HA, a plurality of fourth layer lines M4 may be located on the third inter-layered insulating layer 109c and be spaced apart from each other at predetermined intervals. The fourth layer lines M4 may be located at the same layer as the connection electrode GNT and formed of the same material as the connection electrode GNT.

The fourth layer lines M4 may be electrically connected to a data line DL which is different from a data line DL connected to the third layer lines M3.

In the switching region TrA, a fourth inter-layered insulating layer 109d may be located on the connection electrode GNT and include a connection contact hole PH2 exposing the connection electrode GNT. An anode 121 of the organic light emitting diode E may be located on the fourth inter-layered insulating layer 109d and be connected to the connection electrode GNT through the connection contact hole PH2.

The anode 121 may be formed of a metal material having a high reflectance. For example, the anode 121 may have a stack structure of aluminum (Al) and titanium (Ti) (e.g., Ti/Al/Ti), a stack structure of aluminum (Al) and ITO (e.g., ITO/Al/ITO), an APC alloy structure (e.g., Ag/Pd/Cu), a stack structure of APC alloy and ITO (e.g., ITO/APC/ITO).

The anode 121 may be located in each pixel P. A bank insulating layer 109e may be located between the anodes 121 of the pixels P. In other words, with the bank insulating layer 109e as a boundary of each pixel P, the anode 121 may be separated by pixel P.

In the organic light emitting display device 100, a plurality of fifth layer lines M5 may be located on the fourth inter-layered insulating layer 109d in the line region LA of the hole bezel region HA and be spaced apart from each other at predetermined intervals. The fifth layer lines M5 may be located at the same layer as the anode 121.

The fifth layer lines M5 may be electrically connected to a data line DL which is different from data lines DL connected to the third layer lines M3 and the fourth layer lines M4.

The bank insulating layer 109e may be located on the fifth layer lines M5.

An emitting layer 123 may be located entirely on the substrate 101 having the anode 121 and the bank insulating layer 109e. The emitting layer 123 may be a common layer which is formed in common over the pixels P. The emitting layer 123 may be a white emitting layer emitting a white light.

In this case, the emitting layer 123 may be formed in a tandem structure having 2 or more stacks. Each stack may include a hole transporting layer, at least one emitting layer, and an electron transporting layer. A charge generating layer may be formed between the stacks. The charge generating layer may include an n-type charge generating layer which is located adjacent to a lower stack, and a p-type charge generating layer which is formed on the n-type charge generating layer and is located adjacent to an upper stack.

Further, the n-type charge generating layer may inject electrons to the lower stack, and the p-type charge generating layer may inject holes to the upper stack. The n-type charge generating layer may be an organic layer in which an organic host material having an electron-transporting ability is doped with an alkali metal such as Li, Na, K or Cs, or an alkali earth metal such as Mg, Sr, Ba or Ra. The p-type charge generating layer may include an organic host material having a hole-transporting ability doped with a dopant.

A cathode 125 may be located entirely on the emitting layer 123. Similar to the emitting layer 123, the cathode 125 may be a common layer which is formed in common over the pixels P. The cathode 125 may be formed of a transparent conductive material (TCO) such as ITO or IZO, or a semi-transmissive conductive material such as Mg, Ag or an alloy of Mg and Ag.

In case that the cathode 125 is formed of the semi-transmissive conductive material, light output efficiency can increase due to a micro cavity.

A capping layer may be formed on the cathode 125.

Regarding the organic light emitting diode E, when predetermined voltages are applied to the anode 121 and the cathode 125 according to selected signals, holes from the anode 121 and electrons from the cathode 125 are transported to the emitting layer 123 to form excitons, and when a transition of the excitons from an excited state to a ground state happens, light is generated and emitted.

The emitted light may pass through the cathode 125 and be output to the outside, and thus the organic light emitting display device 100 may finally display an image.

A protection film 130 of a thin film type may be located on the driving thin film transistor DTr and the organic light emitting diode E, and thus the organic light emitting display device 100 may be encapsulated.

As described above, in the organic light emitting display device 100 according to the first embodiment of the present invention, the fifth layer lines M5 may be formed at the same layer as the anode 121 of the organic light emitting diode E and of the same material as the anode 121 in the line region LA of the hole bezel region HA. Thus, the line region LA of the hole bezel region HA may be formed with the first to fifth layer lines M1, M2, M3, M4 and M5. Accordingly, a width of the line region LA can be reduced.

Because a width of the line region LA is reduced, the hole bezel region HA can be reduced, and the display device 100 having a narrow hole bezel as required recently can be provided.

The first to fifth layer lines M1, M2, M3, M4 and M5 may overlap alternately. In other words, the first layer lines M1 and the second layer lines M2 do not overlap each other in a plan view but are arranged alternately and repeatedly, and similarly, the second layer lines M2 and the third layer lines M3 do not overlap each other in a plan view but are arranged alternately and repeatedly.

Further, the third layer lines M3 and the fourth layer lines M4 do not overlap each other in a plan view but are arranged alternately and repeatedly, and similarly, the fourth layer lines M4 and the fifth layer lines M5 do not overlap each other in a plan view but are arranged alternately and repeatedly.

Accordingly, with a width of the line region LA being reduced, parasitic capacitance being produced between the first and second layer lines M1 and M2 connected to the gate line GL can be reduced, and parasitic capacitance being produced between the third to fifth layer lines M3 to M5 connected to the data line DL can be reduced.

Thus, a reduction of a display quality due to a parasitic capacitance can be prevented.

Second Embodiment

To avoid repeated explanations, parts having the same or like functions of the first embodiment use the same reference marks, and characteristic contents of a second embodiment are explained below.

Figure 5:
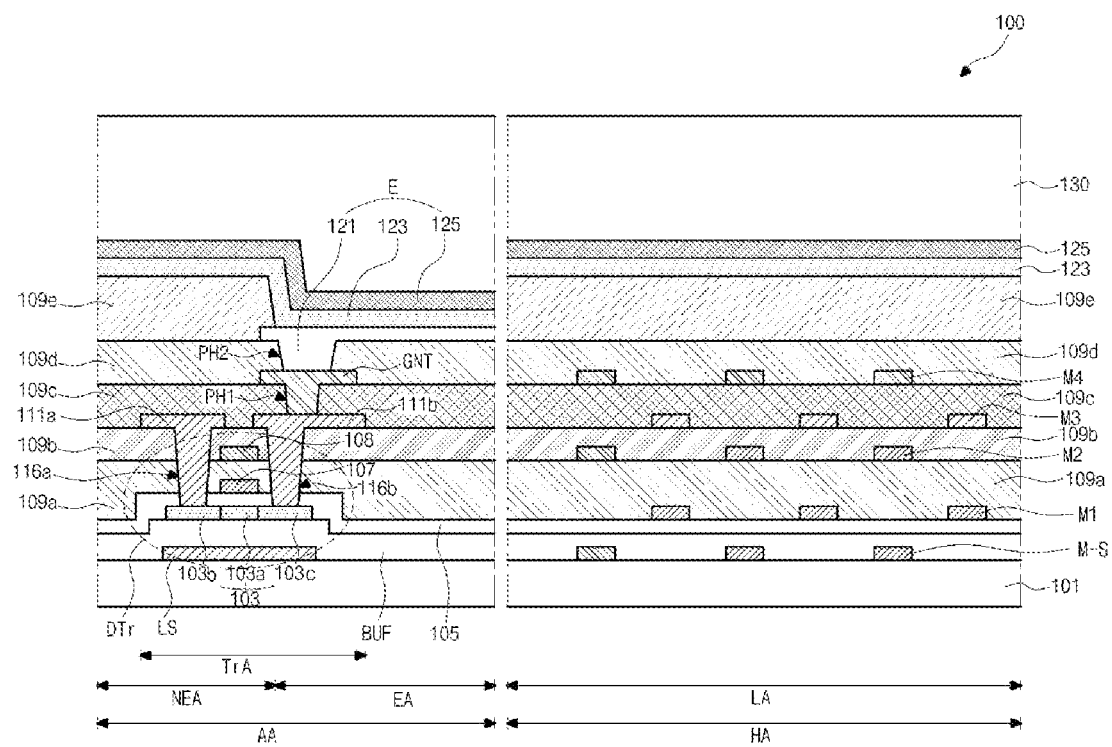
FIG. 5 is a cross-sectional view illustrating a structure of a pixel and a line region of a hole bezel region of an organic light emitting display device according to a second embodiment of the present invention.
Figure 6:
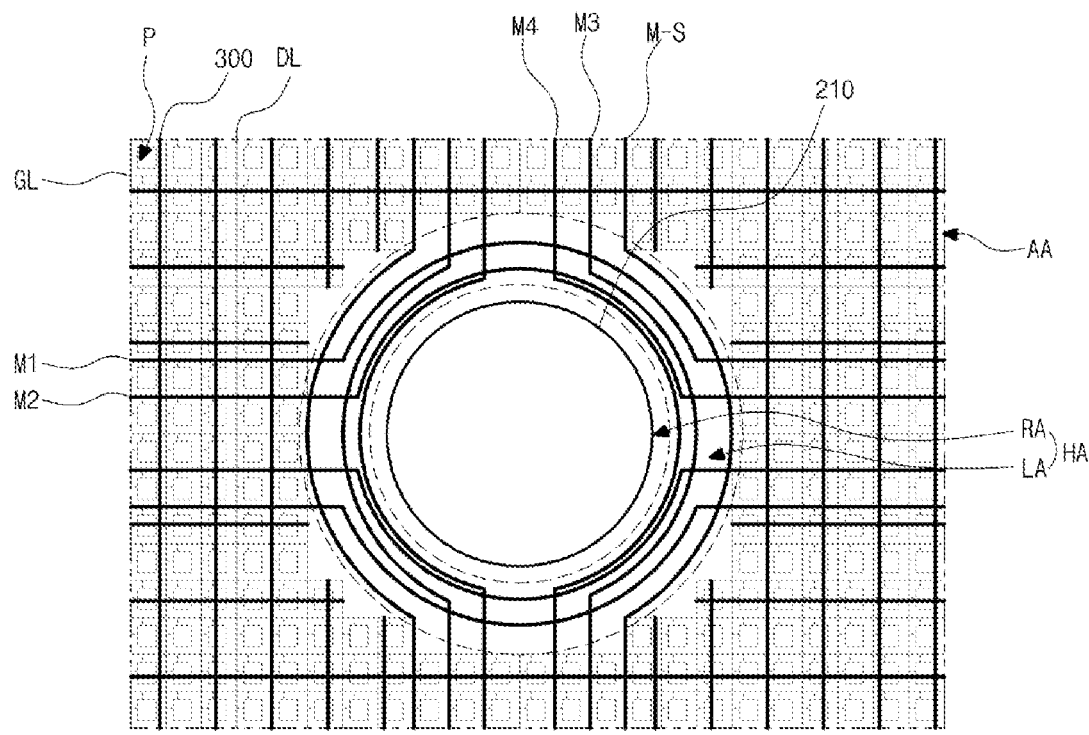
FIG. 6 is a schematic view illustrating a configuration of a hole bezel region and an auxiliary electrode according to a second embodiment of the present invention.

FIG. 5 is a cross-sectional view illustrating a structure of a pixel and a line region of a hole bezel region of an organic light emitting display device according to a second embodiment of the present invention, and FIG. 6 is a schematic view illustrating a configuration of a hole bezel region and an auxiliary electrode according to a second embodiment of the present invention.

A buffer layer BUF may be located on the substrate 101. In the switching region TrA located in the non-emission region NEA of each pixel P, a semiconductor layer 103 may be located on the buffer layer BUF.

The semiconductor layer 103 may be formed of silicon. The semiconductor layer 103 may include an active region 103a forming a channel at a center portion thereof, and source and drain regions 103b and 103c doped with high concentrated impurities at both sides of the active region 103a.

A light blocking layer LS may be formed below the semiconductor layer 103 in order to prevent an external light from affecting a property of the driving thin film transistor DTr.

The light blocking layer LS may be formed of an opaque conductive material of a low resistance to block light. For example, the light blocking layer LS may be formed of an aluminum based metal such as aluminum (Al) or aluminum alloy, a silver based metal such as silver (Ag) or silver alloy, a copper based metal such as copper (Cu) or copper alloy, a molybdenum based metal such as molybdenum (Mo) or molybdenum alloy, chromium (Cr), tantalum (Ta), or titanium (Ti).

In the line region LA of the hole bezel region HA, a plurality of auxiliary layer lines M-S may be located on the buffer layer BUF and be spaced apart from each other at predetermined intervals. The auxiliary layer lines M-S may be electrically connected to the data line DL.

A gate insulating layer 105 may be formed on the substrate 101 having the light blocking layer LS and the semiconductor layer 103. A gate electrode 107 corresponding to the active region 103a of the semiconductor layer 103, and a gate line GL may be formed on the gate insulating layer 105. The gate electrode 107 may be connected to one electrode of a storage capacitor.

In the line region LA of the hole bezel region HA, a plurality of first layer lines M1 may be located on the gate insulating layer 105 and be spaced apart from each other at predetermined intervals. The first layer lines M1 may be located at the same layer as the gate line GL and the gate electrode 107, and may be electrically connected to the gate line GL.

A first inter-layered insulating layer 109a may be formed on the gate electrode 107, the gate line GL and the first layer lines M1. An upper electrode 108 may be located on the first inter-layered insulating layer 109a corresponding to the gate electrode 107. The upper electrode 108 may be connected to the other electrode of the storage capacitor.

In the line region LA of the hole bezel region HA, a plurality of second layer lines M2 may be located on the first inter-layered insulating layer 109a and be spaced apart from each other at predetermined intervals. The second layer lines M2 may be electrically connected to an emission control line, or may be electrically connected to a gate line GL which is different from a gate line GL connected to the first layer line M1.

In the switching region TrA, the first and second inter-layered insulating layers 109a and 109b and the gate insulating layer 105 may include a first semiconductor contact hole 116a and a second semiconductor contact hole 116b respectively exposing the source region 103b and the drain region 103c which are located at both sides of the active region 103a.

A source electrode 111a and a drain electrode 111b may be located on the second inter-layered insulating layer 109b having the first and second semiconductor contact holes 116a and 116b. The source and drain electrodes 111a and 111b may be spaced apart from each other and contact the source and drain regions 103b and 103c exposed through the first and second semiconductor contact holes 116a and 116b, respectively.

In the line region LA of the hole bezel region HA, a plurality of third layer lines M3 may be located on the second inter-layered insulating layer 109b and be spaced apart from each other at predetermined intervals. The third layer lines M3 may be located at the same layer as the data line DL and the source and drain electrodes 111a and 111b and may be electrically connected to the data line DL.

A third inter-layered insulating layer 109c may be located on the source and drain electrodes 111a and 111b and the third layer line M3.

A drain contact hole PH1 may be formed in the third inter-layered insulating layer 109c and expose the drain electrode 111b. A connection electrode GNT may be formed on the third inter-layered insulating layer 109c and contact the drain electrode 111b exposed through the drain contact hole PHE In the line region LA of the hole bezel region HA, a plurality of fourth layer lines M4 may be located on the third inter-layered insulating layer 109c and be spaced apart from each other at predetermined intervals. The fourth layer lines M4 may be located at the same layer as the connection electrode GNT.

The fourth layer lines M4 may be electrically connected to a data line DL which is different from a data line DL connected to the third layer lines M3.

In the switching region TrA, a fourth inter-layered insulating layer 109d may be located on the connection electrode GNT and include a connection contact hole PH2 exposing the connection electrode GNT. An anode 121 of the organic light emitting diode E may be located on the fourth inter-layered insulating layer 109d and be connected to the connection electrode GNT through the connection contact hole PH2.

The anode 121 may be located in each pixel P. A bank insulating layer 109e may be located between the anodes 121 of the pixels P.

An emitting layer 123 may be located entirely on the substrate 101 having the anode 121 and the bank insulating layer 109e. The emitting layer 123 may be a common layer which is formed in common over the pixels P. The emitting layer 123 may be a white emitting layer emitting a white light.

A cathode 125 may be located entirely on the emitting layer 123. Similar to the emitting layer 123, the cathode 125 may be a common layer which is formed in common over the pixels P. The cathode 125 may be formed of a TCO such as ITO or IZO, or a semi-transmissive conductive material such as Mg, Ag or an alloy of Mg and Ag.

A protection film 130 of a thin film type may be located on the driving thin film transistor DTr and the organic light emitting diode E, and thus the organic light emitting display device 100 may be encapsulated.

As described above, in the organic light emitting display device 100 according to the second embodiment of the present invention, the auxiliary layer lines M-S may be formed at the same layer as the light blocking layer LS and of the same material as the light blocking layer LS in the line region LA of the hole bezel region HA. Thus, the line region LA of the hole bezel region HA may be formed with the first to fourth layer lines M1, M2, M3 and M4 and the auxiliary layer lines M-S. Accordingly, a width of the line region LA can be reduced.

Because a width of the line region LA is reduced, the hole bezel region HA can be reduced, and the display device 100 having a narrow hole bezel as required recently can be provided.

Particularly, in the organic light emitting display device 100 according to the second embodiment of the present invention, the auxiliary electrode 300 may be formed at the same layer as the light blocking layer LS and the auxiliary layer lines M-S and of the same material as the light blocking layer LS and the auxiliary layer lines M-S.

Accordingly, problems of a deviation of current being produced and a non-uniformity of brightness being caused due to an increase of resistance of a driving low voltage line can be resolved.

In other words, a driving voltage line applied with a driving voltage and a driving low voltage line applied with a driving low voltage may be formed at the same layer as the data line DL, and the driving voltage line and the driving low voltage line may be parallel with the data line DL and be formed between adjacent pixels P.

The driving low voltage line may be connected to a cathode 125 of the organic light emitting diode E and transfer a low potential voltage (i.e., a VSS voltage).

The cathode 125 being formed in a double-layered structure rather than in a single-layered structure is because the cathode 125 is formed in a very thin film type to be in a transparent state. Thus, the very thin film due to a property of a metal forming the cathode 125 has its own very high resistance.

This cathode 125 produces a deviation of current, and thus a non-uniformity of brightness over the pixels P is caused.

In the organic light emitting display device 100 according to the second embodiment of the present invention, the auxiliary electrode 300 may be formed at the same layer as the light blocking layer LS and the auxiliary layer lines M-S and of the same material as the light blocking layer LS and the auxiliary layer lines M-S, may correspond to the display region AA, and may be electrically connected to the driving low voltage line.

Referring to FIG. 6, the auxiliary electrode 300 may be formed in a mesh structure in the display region AA. Because the auxiliary electrode 300 and the cathode 125 may contact each other, the resistance of the cathode 125 can be reduced.

In the above explanations, the first and second layer lines M1 and M2 being respectively connected to the gate line GL and the emission control line are shown by way of example. However, the first and second layer lines M1 and M2 may be electrically connected to the data line DL, the driving voltage line, and the driving low voltage line.

Further, the third and fourth layer lines M3 and M4 being respectively connected to the data line DL, the driving voltage line and the driving low voltage line are shown by way of example. However, the third and fourth layer lines M3 and M4 may be electrically connected to the gate line DL and the emission control line. The auxiliary layer lines M-S and the first layer lines M1 may not overlap each other in a plan view, and be alternately arranged repeatedly.

In the above second embodiment, it is possible that the auxiliary layer lines M-S are electrically connected to the data line, and the first to fourth layer lines are electrically connected to the gate lines GL.

As described above, in the line region of the hole bezel region of the organic light emitting display device of the embodiments of the present invention, the fifth layer line may be formed at the same layer as and of the same material as the anode of the organic light emitting diode, or the auxiliary layer line may be formed at the same layer as and of the same material as the light blocking layer. Thus, the line region of the hole bezel region may include the first to fourth line layers, and the fifth layer line or the auxiliary layer line. Accordingly, a width of the line region can be reduced.

Accordingly, the hole bezel region can also be reduced, and the display device having a narrow hole bezel as required recently can be provided.

Further, the auxiliary electrode may be formed at the same layer as and of the same material as the auxiliary layer line in the display region. Thus, there is an advantage that problems of a deviation of current being produced and a non-uniformity of brightness being caused due to an increase of resistance of a driving low voltage line can be resolved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a through hole;

a line region surrounding the through hole;
a display region surrounding the line region;
first to fourth layer lines in the line region and disposed at different layers;
auxiliary layer lines below the first layer lines;
pixels in the display region;
first signal lines electrically connected to the pixels and disposed along a first direction; and
second signal lines electrically connected to the pixels and disposed along a second direction intersecting the first direction,
wherein the auxiliary layer lines are electrically connected to one of the second signal lines,
wherein a pixel includes a driving thin film transistor including a semiconductor layer, a gate electrode, an upper electrode, a source electrode, a drain electrode, and a connection electrode,
wherein the gate electrode and the upper electrode are electrically connected to a corresponding one of the first signal lines, and
wherein the source electrode, the drain electrode, and the connection electrode are electrically connected to a corresponding one of the second signal lines,
wherein the pixel further includes an organic light emitting diode including an anode electrically connected to the drain electrode and the connection electrode, and an emitting layer and a cathode being sequentially disposed on the anode,
the display device further comprising a light blocking layer below the semiconductor layer,
wherein the auxiliary layer lines are formed at a same layer as and of a same material as the light blocking layer.

2. The display device of claim 1, wherein the first layer lines are formed at the same layer as and of the same material as the gate electrode, and the second layer lines are formed at the same layer as and of the same material as the upper electrode.

3. The display device of claim 1, wherein the third layer lines are formed at the same layer as and of the same material as the source and drain electrodes, and the fourth layer lines are formed at the same layer as and of the same material as the connection electrode.

4. The display device of claim 1, further comprising an auxiliary electrode which is formed at the same layer as and of the same material as the auxiliary layer lines in the display region,
wherein the auxiliary electrode is electrically connected to the cathode.

5. The display device of claim 2, wherein the first and second layer lines do not overlap each other in a plan view, and are alternately and repeatedly arranged.

6. The display device of claim 5, wherein the auxiliary layer lines and the first layer lines do not overlap each other in a plan view, and are alternately and repeatedly arranged.

7. The display device of claim 3, wherein the third and fourth layer lines do not overlap each other in a plan view, and are alternately and repeatedly arranged.

8. The display device of claim 1, wherein the first and second layer lines include the first signal lines.

9. The display device of claim 1, wherein the third and fourth layer lines include the second signal lines.

10. The display device of claim 1, wherein a first inter-layered insulating layer is disposed between the first and second layer lines, a second inter-layered insulating layer is disposed between the second and third layer lines, a third inter-layered insulating layer is disposed between the third and fourth layer lines, a fourth inter-layered insulating layer is disposed between the fourth layer lines and the anode on the fourth layer lines or a gate insulating layer is disposed between the first layer lines and the auxiliary layer lines below the first layer lines.

11. The display device of claim 10, further comprising a dam disposed outside the first to fourth inter-layered insulating layers, wherein the dam is disposed to fully surround the through hole.

12. The display device of claim 1, wherein the first and second layer lines are electrically connected to different first signal lines.

13. The display device of claim 1, wherein the third, the fourth, and auxiliary layer lines are electrically connected to different second signal lines respectively.

14. A display device, comprising:
a through hole;
a line region surrounding the through hole;
a display region surrounding the line region;
first to fourth layer lines in the line region and disposed at different layers;
auxiliary layer lines below the first layer lines or disposed on the fourth layer lines;
pixels in the display region;
first signal lines electrically connected to the pixels and disposed along a first direction; and
second signal lines electrically connected to the pixels and disposed along a second direction intersecting the first direction,
wherein the auxiliary layer lines are electrically connected to one of the second signal lines,
wherein a pixel includes a driving thin film transistor including a semiconductor layer, a gate electrode, an upper electrode, a source electrode, a drain electrode, and a connection electrode,
wherein the gate electrode and the upper electrode are electrically connected to a corresponding one of the first signal lines, and
wherein the source electrode, the drain electrode, and the connection electrode are electrically connected to a corresponding one of the second signal lines,
wherein the third layer lines are formed at the same layer as and of the same material as the source and drain electrodes, and the fourth layer lines are formed at a same layer as and of a same material as the connection electrode,
wherein the third and fourth layer lines do not overlap each other in a plan view, and are alternately and repeatedly arranged, and
wherein when the auxiliary layer lines are disposed on the fourth layer lines, the auxiliary layer lines and the fourth layer lines do not overlap each other in a plan view, and are alternately and repeatedly arranged.

* * * * *